US011800683B2

(12) United States Patent
Horng et al.

(10) Patent No.: US 11,800,683 B2
(45) Date of Patent: Oct. 24, 2023

(54) IMMERSION COOLING SYSTEM

(71) Applicant: Sunonwealth Electric Machine Industry Co., Ltd., Kaohsiung (TW)

(72) Inventors: Alex Horng; Tso-Kuo Yin, Kaohsiung (TW); Ming-Tsung Li, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 227 days.

(21) Appl. No.: 17/536,267

(22) Filed: Nov. 29, 2021

(65) Prior Publication Data
US 2022/0264768 A1  Aug. 18, 2022

(30) Foreign Application Priority Data

Feb. 17, 2021 (TW) ................................. 110105327
Mar. 5, 2021 (TW) ................................. 110107967

(51) Int. Cl.
*H05K 7/20* (2006.01)
(52) U.S. Cl.
CPC ......... *H05K 7/20327* (2013.01); *H05K 7/203* (2013.01); *H05K 7/20318* (2013.01)
(58) Field of Classification Search
CPC ............... H05K 7/203; H05K 7/20236; H05K 7/20818; H05K 7/20272; H05K 7/20327; H05K 7/20318; H05K 7/208; H05K 1/0203; H05K 1/0272; H05K 7/20281; H05K 9/0049; H05K 7/20781; G06F 1/20; G06F 1/206; G06F 2200/201; H01L 23/44; H01L 23/473

USPC .............. 361/700, 699; 165/104.13, 104.21, 165/104.33, 80.4
See application file for complete search history.

(56) References Cited

U.S. PATENT DOCUMENTS

| 8,619,425 | B2 | 12/2013 | Campbell et al. |
| 10,156,873 | B2 | 12/2018 | Shelnutt et al. |
| 11,064,631 | B2 | 7/2021 | So et al. |
| 11,375,638 | B2* | 6/2022 | Cheng ................ H05K 7/20318 |
| 2007/0153480 | A1* | 7/2007 | Zhang ...................... C09K 5/04 |
| | | | 257/E23.098 |
| 2016/0307685 | A1* | 10/2016 | White ..................... H01F 27/00 |
| 2019/0383559 | A1* | 12/2019 | Aoki ................... F28D 1/05316 |
| 2021/0410319 | A1* | 12/2021 | Manousakis ....... H05K 7/20809 |

(Continued)

FOREIGN PATENT DOCUMENTS

WO    WO2020115602 A1    6/2020

*Primary Examiner* — Mandeep S Buttar

(57) ABSTRACT

An immersion cooling system includes a sealed tank having a chamber. A circulating layer and a working layer are respectively formed by first and second working liquids filled in the chamber and are contiguous to each other. The boiling point of the second working liquid is higher than that of the first working liquid. The density of the second working liquid is lower than that of the first working liquid. The first and second working liquids do not dissolve in each other. A circulating cooling module includes a circulating pipeline having first and second ports located in the chamber. The circulating pipeline also has a heat absorbing section and a condensation section located between the first and second ports. The heat absorbing section is located in the working layer. The first working liquid flows into the circulating pipeline from the first port and circulates in the circulating pipeline.

23 Claims, 4 Drawing Sheets

(56) References Cited

U.S. PATENT DOCUMENTS

| | | | |
|---|---|---|---|
| 2022/0017803 A1 | 1/2022 | Fayemi et al. | |
| 2022/0239198 A1* | 7/2022 | Dogruoz | G06F 1/20 |
| 2023/0156959 A1* | 5/2023 | Malouin | H05K 7/20272 |
| | | | 361/699 |
| 2023/0209773 A1* | 6/2023 | Alissa | H05K 7/20327 |
| | | | 361/505 |
| 2023/0217630 A1* | 7/2023 | Gao | H05K 7/20236 |
| | | | 361/699 |

* cited by examiner

IMMERSION COOLING SYSTEM

CROSS REFERENCE TO RELATED APPLICATION

The application claims the benefit of Taiwan application Ser. No. 110105327, filed on Feb. 17, 2021, and Taiwan application Ser. No. 110107967, filed on Mar. 5, 2021, and the entire contents of which are incorporated herein by reference.

BACKGROUND OF THE INVENTION

1. Field of the Invention

The present invention relates to a cooling system and, more particularly, to an immersion cooling system.

2. Description of the Related Art

Immersion cooling includes immersing an electronic device (such as a server, a motherboard, a central processing unit, a graphics card, a memory, etc.) into an electrically non-conductive liquid, such that the high heat energy generated during operation of the electronic device can be directly absorbed by the electrically non-conductive liquid, maintaining the electronic device at a suitable working temperature to achieve the expected operating efficiency and service life. The electrically non-conductive liquid can be a single-phase working liquid with a higher boiling point, or a two-phase working liquid with a lower boiling point and a better heat-exchange performance.

A conventional immersion cooling system using a two-phase working liquid generally includes a cooling tank and a condenser. A lower layer of the cooling tank is filled with a two-phase working liquid in a liquid state. The condenser is mounted in an upper layer of the cooling tank and located above the two-phase working liquid in the liquid state. A to-be-cooled electronic device is immersed in the two-phase working liquid in the liquid state. Since the two-phase working liquid has a lower boiling point, a portion of the two-phase working liquid turns into a gaseous state after absorbing the heat generated during operation of the electronic device, and bubbles are formed in the liquid two-phase working liquid and float upwards until they leave the level surface of the liquid two-phase working liquid. After contacting the condenser, the gaseous working liquid condenses into the liquid state and drips.

Although the two-phase working liquid can provide a better heat exchange performance due to the low-temperature boiling effect, the two-phase working liquid is expensive and causes considerable costs when the cooling tank is filled with the two-phase working liquid only, leading to an economic burden to the user.

Thus, it is necessary to improve the conventional immersion cooling system.

SUMMARY OF THE INVENTION

To solve the above problems, it is an objective of the present invention to provide an immersion cooling system capable of reducing the amount of the two-phase working liquid used.

It is another objective of the present invention to provide an immersion cooling system capable of increasing the cooling efficiency.

It is a further objective of the present invention to provide an immersion cooling system capable of reducing the overall volume.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

As used herein, the term "coupling", "engagement", "assembly", or similar terms is used to include separation of connected members without destroying the members after connection or inseparable connection of the members after connection. A person having ordinary skill in the art would be able to select according to desired demands in the material or assembly of the members to be connected.

An immersion cooling system according to the present invention includes a sealed tank, a circulating layer, a working layer, and a circulating cooling module. The sealed tank includes a chamber. The circulating layer is formed by a first working liquid filled in the chamber. The working layer is formed by a second working liquid filled in the chamber. A boiling point of the second working liquid is higher than a boiling point of the first working liquid. A density of the second working liquid is lower than a density of the first working liquid. The first working liquid and the second working liquid do not dissolve in each other. The circulating layer and the working layer are contiguous to each other. The circulating cooling module includes a circulating pipeline having a first port and a second port. The circulating pipeline further has a heat absorbing section and a condensation section, which are located between the first port and the second port. The first port and the second port are located in the chamber. The heat absorbing section is located in the working layer. The first working liquid flows into the circulating pipeline from the first port and circulates in the circulating pipeline.

Thus, the immersion cooling system according to the present invention uses the first working liquid and the second working liquid at the same time to proceed with cooling. The first working liquid, which is relatively expensive and has a better heat exchange performance, can be used only in the circulating pipeline to proceed with heat exchange. Thus, the user can significantly reduce the amount of the first working liquid used, thereby saving considerable costs. Furthermore, the circulating pipeline can further be coupled with the cooling fins, the fans, and the pump to further increase the cooling efficiency of the immersion cooling system.

In an example, the boiling point of the first working liquid may be lower than a boiling point of water. Thus, the heat exchange performance is increased.

In an example, the density of the first working liquid may be higher than a density of water, and the density of the second working liquid may be lower than the density of water. Thus, the first working liquid and the second working liquid naturally separate from each other to form two layers.

In an example, both the first working liquid and the second working liquid are electrically non-conductive liquids, which can be used to cool electronic devices.

In an example, the circulating pipeline may not be a closed loop. Thus, the cooled first working liquid successively enters the circulating pipeline.

In an example, the condensation section may be outside of the circulating layer and the working layer. Thus, the condensation section may use an ampler cooling space, increasing the cooling efficiency.

In an example, the condensation section may be located in the chamber. Thus, the overall volume of the immersion cooling system is reduced.

In an example, the circulating cooling module may further include a plurality of cooling fins coupled to the condensation section. Thus, the cooling area is increased.

In an example, the circulating cooling module may further include at least one fan coupled to the condensation section. Thus, the circulation of air can be speeded up.

In an example, the second port may be located in the working layer. Thus, the circulating pipeline can have a shorter length to save the material.

In an example, the circulating cooling module includes a check valve located between the condensation section and the second port. The check valve has an outlet intercommunicating with the second port. Thus, the second working liquid is prevented from entering the circulating pipeline.

In an example, the second port may be located in the circulating layer. Thus, the returning first working liquid in the circulating pipeline can directly flow into the circulating layer, increasing the replenishing speed of the first working liquid.

In an example, the circulating pipeline includes a return flow section contiguous to the second port. The return flow section has a plurality of through-holes. Thus, the air in the pipeline can be expelled.

In an example, the circulating cooling module may include at least one cold plate coupled to the heat absorbing section. The at least one cold plate has a compartment. The first working liquid in the circulating layer intercommunicates with the compartment. The at least one cold plate includes an outer surface having a heat absorbing face. Thus, the cooling efficiency is increased.

In an example, the at least one cold plate may include at least one fixing portion. Thus, the cold plate can be secured to the electronic device, such that the heat absorbing face contacts the heat source more tightly.

In an example, the first port may intercommunicate with a liquid outlet of a pump. The pump has a liquid inlet located in the circulating layer. Thus, the circulating speed of the first working liquid can be increased, increasing the cooling efficiency.

In an example, the pump may be located in the chamber. Thus, the area occupied by the immersion cooling system is reduced.

In an example, the circulating cooling module may include a check valve located between the heat absorbing section and the first port. The check valve includes an inlet intercommunicating with the first port. Thus, the check valve can prevent the first working liquid in the circulating pipeline from entering the chamber via the first port, thereby fixing the circulating direction of the first working liquid.

In an example, the circulating cooling module may further include a plurality of cooling fins coupled to an outer surface of the circulating pipeline. The plurality of cooling fins is located in the working layer. Thus, the cooling area of the circulating pipeline is increased.

In an example, the immersion cooling system may further include an air layer formed by air in the chamber. The circulating cooling module may further include a plurality of cooling fins coupled to an outer surface of the circulating pipeline. The plurality of cooling fins is located in the air layer. Thus, once the gaseous second working liquid is present in the air layer, the plurality of cooling fins can re-condense the gaseous second working liquid into the liquid state.

In an example, a color of the first working liquid is different from a color of the second working liquid. Thus, the colorful visual effect can be increased.

In an example, the color of the first working liquid and/or the color of the second working liquid is blended by fat-soluble dyeing agents. Thus, the manufacturing costs are reduced.

In an example, the immersion cooling system further includes at least one electronic device. The at least one electronic device includes at least one heat source located in the working layer. Thus, the electronic device is maintained at a suitable working temperature.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
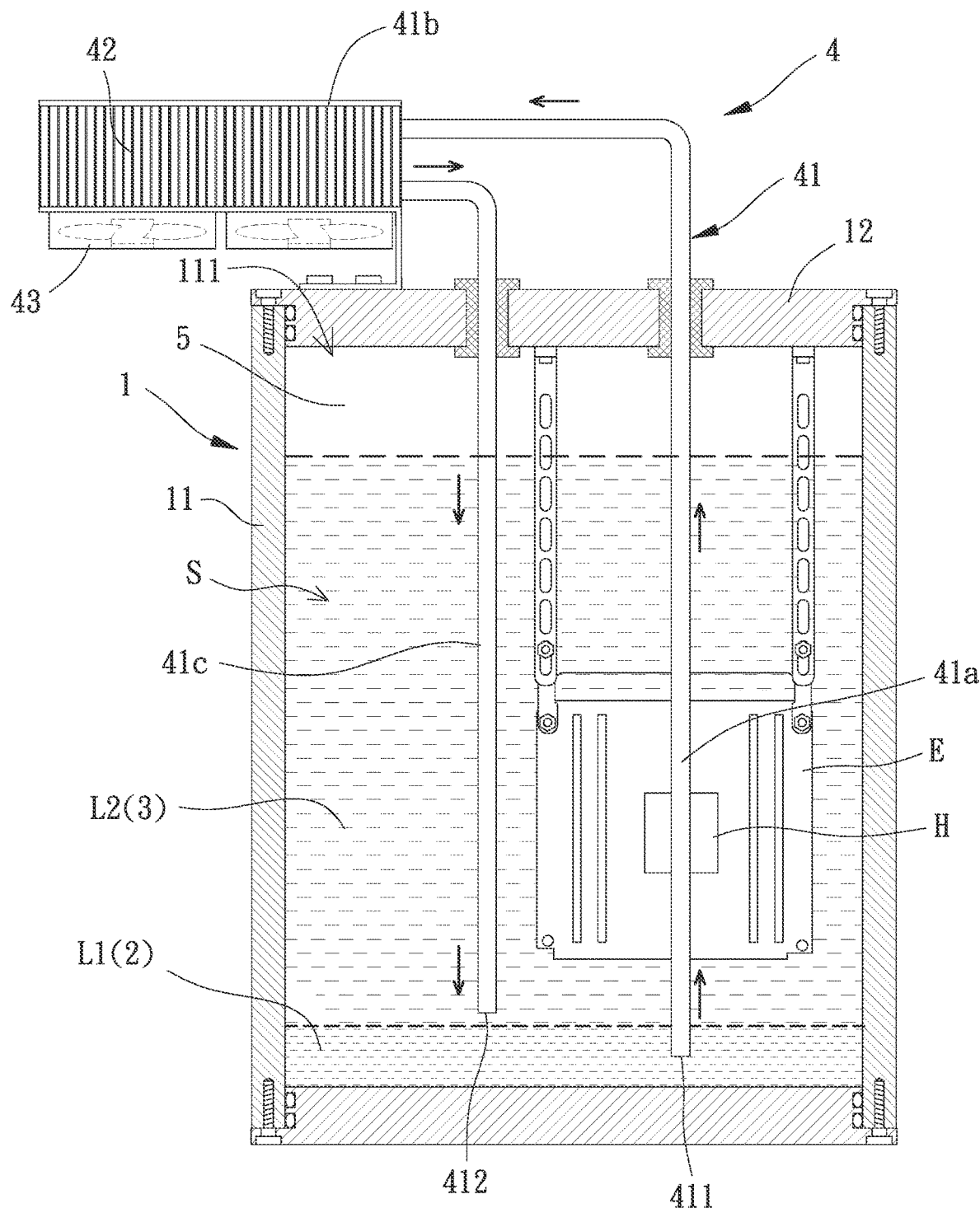
FIG. 1 is a cross sectional view of an immersion cooling system of a first embodiment according to the present invention after assembly.

In the various figures of the drawings, the same numerals designate the same or similar parts. Furthermore, when the terms "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

With reference to FIG. 1, an immersion cooling system of a first embodiment according to the present invention includes a sealed tank 1, a circulating layer 2, a working layer 3, and a circulating cooling module 4. The sealed tank 1 includes a chamber S therein. The circulating layer 2 and the working layer 3 are received in the chamber S. The circulating cooling module 4 intercommunicates with the chamber S.

The present invention is not limited to the type of the sealed tank 1. In this embodiment, the sealed tank 1 may include a container 11 and a cap 12. The chamber S is located in the container 11. The container 11 may optionally be made of a material that can be seen through, such that a user can see through the container 11 to observe the condition in the chamber S. The container 11 includes an opening 111 intercommunicating with the chamber S. The opening 111 can be used to fill liquids into the chamber S or to place a to-be-cooled object into the chamber S or remove the to-be-cooled object out of the chamber S. The cap 12 may cover the opening 111. A periphery of the cap 12 may be sealed, such as by a rubber ring, to form an airtightness with the container 11, such that the gas or liquid in the chamber S will not leak to the outside via the periphery of the cap 12.

The circulating layer 2 is formed by a first working liquid L1 filled in the chamber S. The first working liquid L1 may be a two-phase working liquid that is relatively expensive. The working layer 3 is formed by a second working liquid L2 filled in the chamber S. The boiling point of the second working liquid L2 is higher than the boiling point of the first working liquid L1. The second working liquid L2 can be a relatively cheap single-phase or two-phase working liquid. Preferably, the boiling point of the first working liquid L1 can be lower than the boiling point of water to increase the heat exchange performance of the immersion cooling system. Furthermore, the density of the second working liquid L2 is lower than the density of the first working liquid L1. Preferably, the density of the first working liquid L1 can be higher than the density of water, and the density of the second working liquid L2 can be lower than the density of water. Thus, the first working liquid L1 and the second working liquid L2 can naturally separate from each other in the chamber S to form two layers. Furthermore, the first working liquid L1 and the second working liquid L2 do not dissolve in each other, such that the working layer 3 is contiguous to an upper side of the circulating layer 2. Both the first working liquid L1 and the second working liquid L2 are preferably electrically non-conductive liquids and, thus, can be used to cool electronic devices. Moreover, the color of the first working liquid L1 can be different from the color of the second working liquid L2. For example, one of the first working liquid L1 and the second working liquid L2 may have a transparent color (namely, can be seen through, including transparent and colored, and transparent and colorless). Another of the first working liquid L1 and the second working liquid L2 may have a non-transparent color (namely, cannot be seen through, such as a saturated color, including red, yellow, blue, green, etc.). The color of the first working liquid L1 and/or the color of the second working liquid L2 is preferably blended by fat-soluble dyeing agents.

The immersion cooling system may further include at least one electronic device E. The at least one electronic device E is the object to be cooled and includes at least one heat source H. The at least one electronic device E may be a motherboard, a communication interface board, a graphics card, a data storage board, etc. The at least one electronic device E can be positioned in a pre-determined location in the chamber S, such that the at least one electronic device E can be immersed into and come into contact with the second working liquid L2. For example, the at least one electronic device E may be entirely immersed in the working layer 3, or at least the at least one heat source H of the at least one electronic device E is immersed in the working layer 3. The present invention is not limited in this regard.

The circulating cooling module 4 includes a circulating pipeline 41 allowing the first working liquid L1 to circulate. The circulating pipeline 41 may be made of a thermally conductive material, such as copper, aluminum, titanium, or stainless steel. The circulating pipeline 41 includes a first port 411 intercommunicating with a heat absorbing section 41a. The heat absorbing section 41a intercommunicates with a condensation section 41b, which, in turn, intercommunicates with a second port 412. The first port 411 and the second port 412 are located in the chamber S. In this embodiment, the first port 41 is located in the circulating layer 2, such that the first working liquid L1 can enter the circulating pipeline 41 from the first port 411, and then circulates in the circulating pipeline 41.

Further to the above, the heat absorbing section 41a is a portion of the circulating pipeline 41 passing through the working layer 3. More specifically, the heat absorbing section 41a is located in the working layer 3 and may be adjacent to the at least one heat source H, such that the heat absorbing section 41a absorbs the heat of the at least one heat source H. The condensation section 41b is used to cool the first working liquid L1. The condensation section 41b is preferably outside of the circulating layer 2 and the working layer 3. In this embodiment, the condensation section 41b is located outside of the sealed tank 1. Thus, the condensation section 41b may use an ampler cooling space, increasing the cooling efficiency.

Furthermore, to further increase the cooling efficiency, the circulating cooling module 4 may further include at least one cooler 42. The at least one cooler 42 may be coupled to the condensation section 41b, thereby increasing the cooling area. Preferably, the circulating cooling module 4 may further include at least one fan 43. The at least one fan 43 may also be coupled to the condensation section 41b, thereby speeding up the circulation of air.

The second port 412 is used to permit the cooled first working liquid L1 to flow back into the chamber S. The location of the second port 412 in the chamber S is not limited in the present invention. In this embodiment, the second port 412 may be located in the working layer 3. Thus, the circulating pipeline 41 may have a shorter length to save the material.

In the immersion cooling system of this embodiment, when the at least one electronic device E operates and generates heat, the second working liquid L2 surrounding the at least one electronic device E and the first working liquid L1 in the circulating pipeline 41 absorb the heat energy, such that the at least one electronic device E can be maintained at a suitable working temperature. The second working liquid L2 is used to cool the at least one electronic device E and to proceed heat exchange with the circulating pipeline 41 to maintain the environmental temperature of the working layer 3. The first working liquid L1 is used to accelerate the speed of carrying away the heat from the heat source H.

Specifically, in this embodiment, the circulating pipeline 41 is not a closed loop, such that the cooled first working liquid L1 may successively enter the circulating pipeline 41. Since the first working liquid L1 is only used to proceed with heat exchange in the circulating pipeline 41, the amount of the first working liquid L1 used may be far less than that of the second working liquid L2, such that the user may save considerable costs. Furthermore, since the amount of the second working liquid L2 used is higher than that of the first working liquid L1, under the pressure from the weight of the second working liquid L2, the first working liquid L1 is forced to pass through the first port 411 into the heat absorbing section 41a of the circulating pipeline 41. The first working liquid L1 in the heat absorbing section 41a can absorb the heat of the heat source H and vaporizes into a gaseous state and flows into the condensation section 41b, thereby carrying heat away from the heat source H. The gaseous first working liquid L1 entering the condensation section 41b is cooled to lower the temperature, condenses back into the liquid state, and flows towards the second port 412. The cooled first working liquid L1 can flow back to the working layer 3 via the second port 412. Next, due to the density difference between the first working liquid L1 and the second working liquid L2, the liquid first working liquid L1 naturally sinks to the circulating layer 2 and can then reenter the first port 411 to flow towards the heat absorbing section 41*a*. Thus, the heat of the heat source H is continuously absorbed through continuous circulation.

The first working liquid L1 and the second working liquid L2 can be easily identified by the color difference therebetween. Furthermore, during the procedures in which the first working liquid L1 in the heat absorbing section 41*a* turns into the gaseous state and flows into the condensation section 41*b*, condenses back into the liquid state and flows towards the second port 412, a colorful visual effect can be seen from around the sealed thank 1, which brings not only more business for the industry (such as gaming) but also utility and aesthetics.

Figure 2:
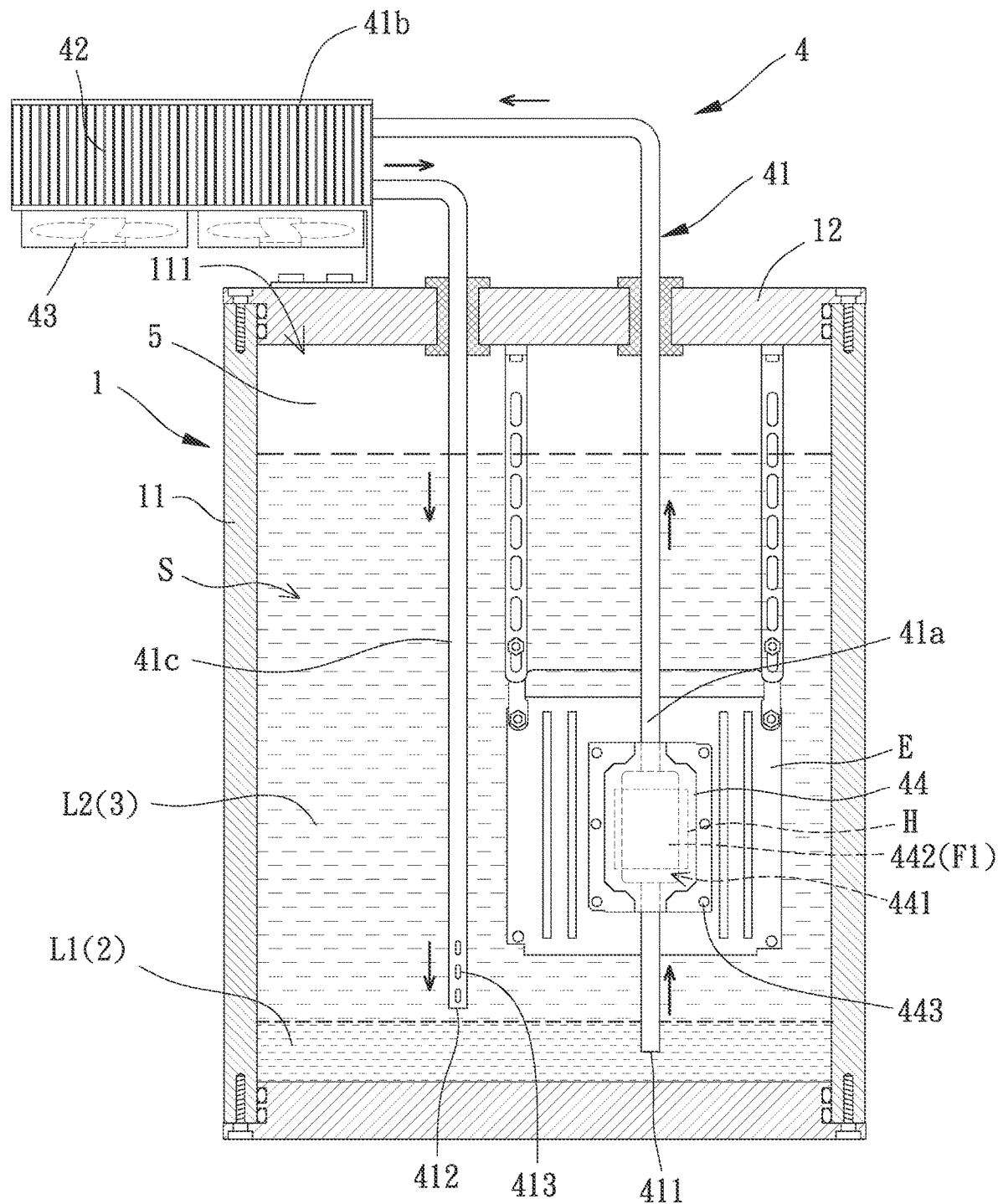
FIG. 2 is a cross sectional view of an immersion cooling system of a second embodiment according to the present invention after assembly.

Please refer to FIG. 2, which shows an immersion cooling system of a second embodiment according to the present invention. In this embodiment, the circulating cooling module 4 may include at least one cold plate 44. The at least one cold plate 44 is coupled to the heat absorbing section 41*a* and has a compartment 441. The liquid of the circulating layer 2 intercommunicates with the compartment 441. An outer surface F1 of the at least one cold plate 44 has a heat absorbing face 442. The heat absorbing face 442 may be used to contact the at least one heat source H. The compartment 441 permits the first working liquid L1 to flow. Thus, the heat of the at least one heat source H can be directly transferred from the heat absorbing face 442 into the compartment 441. Then, the phase change of the first working liquid L1 causes circulating flow to carry away the heat of the at least one heat source H. Thus, the cooling efficiency is increased. Preferably, the at least one cold plate 44 may include at least one fixing portion 443 which can be used to secure the at least one cold plate 44 to the at least one electronic device E. Thus, the at least one fixing portion 443 enables the heat absorbing face 442 to more tightly contact the at least one heat source H.

Furthermore, the circulating pipeline 41 may further include a return flow section 41*c* contiguous to the second port 412. The return flow section 41*c* may have a plurality of through-holes 413. The return flow section 41*c* is used to guide the first working liquid L1 towards the second port 412, such that the first working liquid L1 can flow back into the chamber S. When a portion of the first working liquid L1 in the return flow section 41*c* is still gaseous or air resides in the circulating pipeline 41 during installation of the pipeline, the gas may be expelled through the plurality of through-holes 413, providing an air-expelling function for the pipeline.

Figure 3:
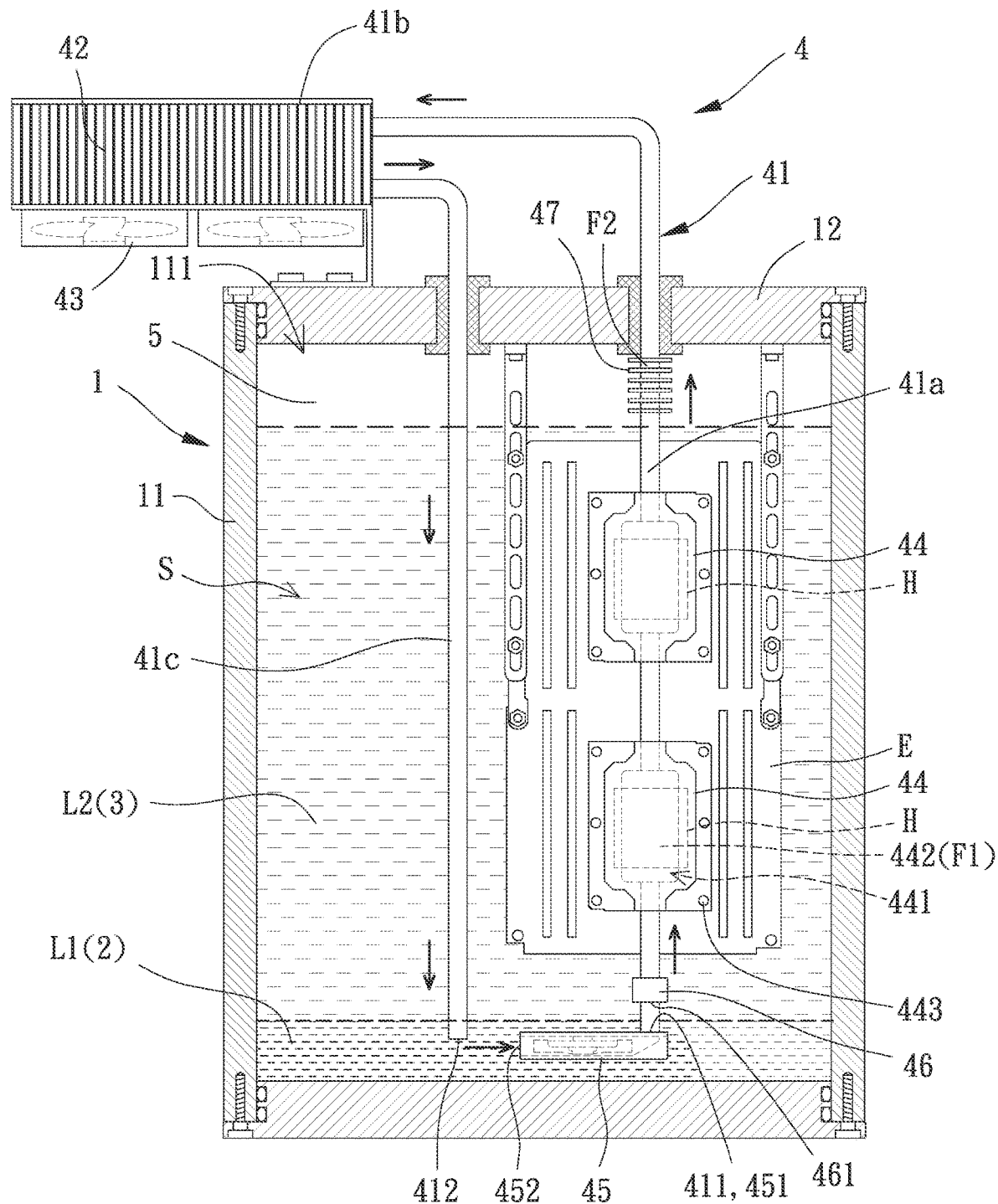
FIG. 3 is a cross sectional view of an immersion cooling system of a third embodiment according to the present invention after assembly.

With reference to FIG. 3 showing an immersion cooling system of a third embodiment according to the present invention, plural electronic devices E may be used. Each electronic device E may include a plurality of heat sources H. In this embodiment, the electronic devices E include two heat sources H, the heat absorbing section 41*a* may pass through each heat source H in sequence, and associated two cold plates 44 cool the heat sources H. The structure of the circulating pipeline 41 may be adjusted according to the number of the electronic devices E and the heat sources H, which can be appreciated by one having ordinary skill in the art.

Furthermore, the circulating cooling module 4 may include a pump 45. A liquid outlet 451 of the pump 45 intercommunicates with the first port 411. The first port 411 may be located in the working layer 3 or more preferably in the circulating layer 2. The present invention is not limited in this regard. A liquid inlet 452 of the pump 45 is located in the circulating layer 2. Thus, the first working liquid L1 can still enter the circulating pipeline 41 and can be driven by the pump 45 to increase the circulating speed, which also increases the speed of carrying away the heat, increasing the cooling efficiency. Preferably, the pump 45 can be located in the chamber S, reducing the area occupied by the immersion cooling system.

The circulating cooling module 4 may further include a check valve 46 located between the heat absorbing section 41*a* and the first port 411. An inlet 461 of the check valve 46 intercommunicates with the first port 411. The check valve 46 can avoid the first working liquid L1 in the circulating pipeline 41 from entering the chamber S via the first port 411. Thus, the check valve 46 can fix the circulating direction of the first working liquid L1.

Furthermore, the immersion cooling system may further include at least one air layer 5 which may be formed by air in the chamber S. The air layer 5 is contiguous to an upper surface of the working layer 3. The air layer 5 provides a cooling space where the gasified first working liquid L1 and/or the gasified second working liquid L2 can re-condense into the liquid state and then flow back to the circulating layer 2 and/or the working layer 3.

The circulating cooling module 4 may preferably include a plurality of cooling fins 47. The plurality of cooling fins 47 is coupled to an outer surface F2 of the circulating pipeline 41 to increase the cooling area of the circulating pipeline 41. The plurality of cooling fins 47 may be located in the working layer 3 or the air layer 5. The present invention is not limited in this regard. In this embodiment, the plurality of cooling fins 47 is located in the air layer 5. Thus, in addition to increasing the cooling area of the circulating pipeline 41, the plurality of cooling fins 47 can assist in reducing the temperature of the gaseous second working liquid L2 to re-condense into the liquid state once the gaseous second working liquid L2 is present in the air layer 5.

As stated above, the position of the second port 412 in the chamber S is not limited in the present invention. In this embodiment, the second port 412 may be located in the circulating layer 2, such that the returning first working liquid L1 in the circulating pipeline 41 can directly flow into the circulating layer 2, increasing the replenishing speed of the first working liquid L1.

Figure 4:
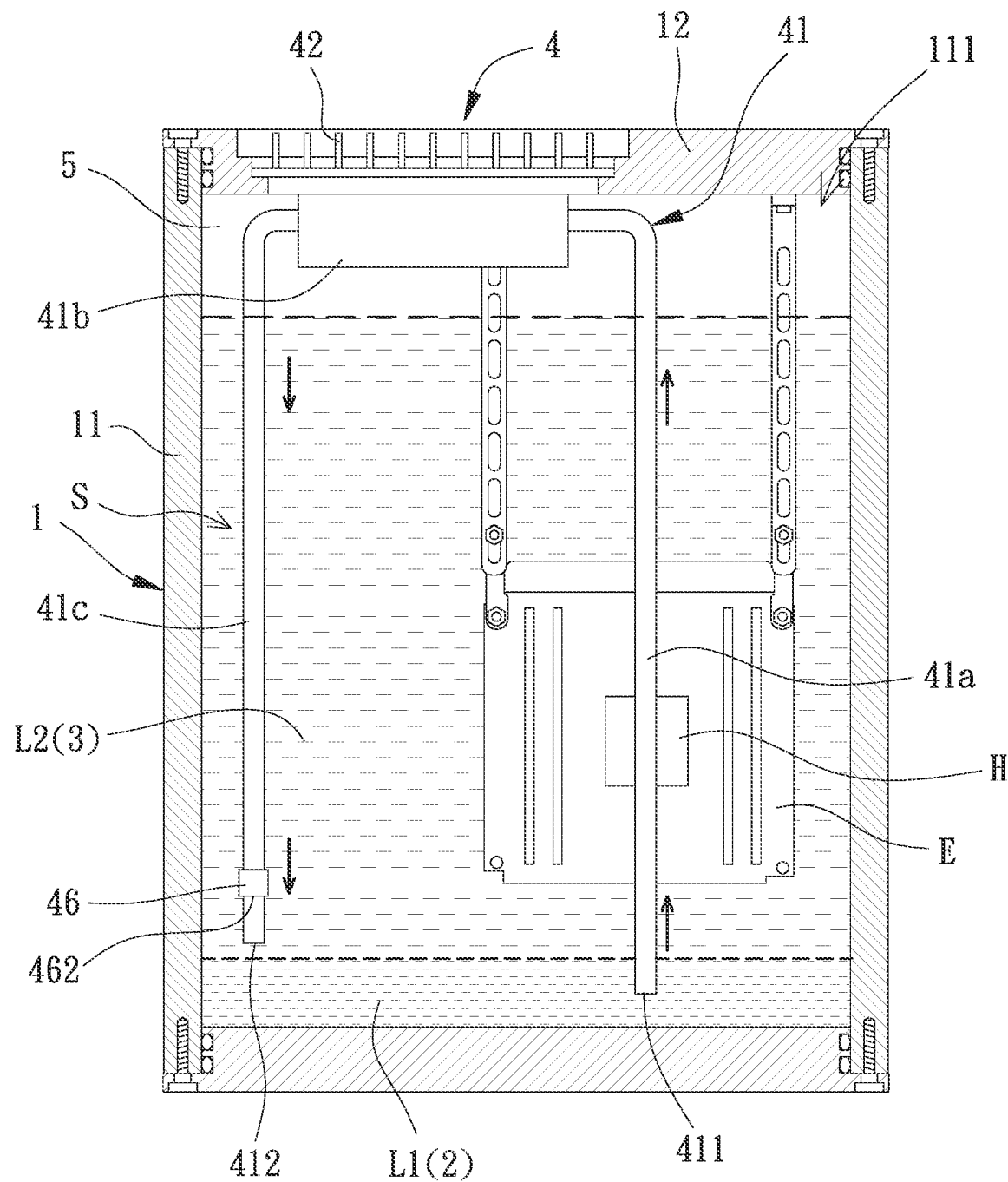
FIG. 4 is a cross sectional view of an immersion cooling system of a fourth embodiment according to the present invention after assembly.

Please refer to FIG. 4, which shows an immersion cooling system of a fourth embodiment according to the present invention. In this embodiment, the condensation section 41*b* may be located in the chamber S. The at least one cooler 42 is coupled to the condensation section 41*b*. The at least one cooler 42 can extend through the cap 12 to contact the external environment for cooling purposes, thereby cooling the first working liquid L1 in the condensation section 41*b*. Thus, the overall volume of the immersion cooling system is reduced. Furthermore, the check valve 46 may also be located between the return flow section 41*c* and the second port 412, and the outlet 462 of the check valve 46 intercommunicates with the second port 412. Thus, the check valve 46 can prevent the second working liquid L2 from entering the circulating pipeline 41 via the second port 412.

In view of the foregoing, the immersion cooling system according to the present invention uses the first working liquid and the second working liquid at the same time to proceed with cooling. The first working liquid, which is relatively expensive and has a better heat exchange performance, can be used only in the circulating pipeline to proceed with heat exchange. Thus, the user can significantly reduce the amount of the first working liquid used, thereby saving considerable costs. Furthermore, the circulating pipeline can further be coupled with the cooling fins, the fans, and the pump to further increase the cooling efficiency of the immersion cooling system.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. An immersion cooling system comprising:
a sealed tank including a chamber;
a circulating layer formed by a first working liquid filled in the chamber;
a working layer formed by a second working liquid filled in the chamber, wherein a boiling point of the second working liquid is higher than a boiling point of the first working liquid, wherein a density of the second working liquid is lower than a density of the first working liquid, wherein the first working liquid and the second working liquid do not dissolve in each other, and wherein the circulating layer and the working layer are contiguous to each other; and
a circulating cooling module including a circulating pipeline having a first port and a second port, wherein the circulating pipeline further has a heat absorbing section and a condensation section, which are located between the first port and the second port, wherein the first port and the second port are located in the chamber, wherein the heat absorbing section is located in the working layer, and wherein the first working liquid flows into the circulating pipeline from the first port and circulates in the circulating pipeline.

2. The immersion cooling system as claimed in claim 1, wherein the boiling point of the first working liquid is lower than a boiling point of water.

3. The immersion cooling system as claimed in claim 1, wherein the density of the first working liquid is higher than a density of water, and the density of the second working liquid is lower than the density of water.

4. The immersion cooling system as claimed in claim 1, wherein both the first working liquid and the second working liquid are electrically non-conductive liquids.

5. The immersion cooling system as claimed in claim 1, wherein the circulating pipeline is not a closed loop.

6. The immersion cooling system as claimed in claim 1, wherein the condensation section is outside of the circulating layer and the working layer.

7. The immersion cooling system as claimed in claim 6, wherein the condensation section is located in the chamber.

8. The immersion cooling system as claimed in claim 6, wherein the circulating cooling module further includes a plurality of cooling fins coupled to the condensation section.

9. The immersion cooling system as claimed in claim 6, wherein the circulating cooling module further includes at least one fan coupled to the condensation section.

10. The immersion cooling system as claimed in claim 1, wherein the second port is located in the working layer.

11. The immersion cooling system as claimed in claim 10, wherein the circulating cooling module includes a check valve located between the condensation section and the second port, and wherein the check valve has an outlet intercommunicating with the second port.

12. The immersion cooling system as claimed in claim 1, wherein the second port is located in the circulating layer.

13. The immersion cooling system as claimed in claim 1, wherein the circulating pipeline includes a return flow section contiguous to the second port, and wherein the return flow section has a plurality of through-holes.

14. The immersion cooling system as claimed in claim 1, wherein the circulating cooling module includes at least one cold plate coupled to the heat absorbing section, wherein the at least one cold plate has a compartment, wherein the first working liquid in the circulating layer intercommunicates with the compartment, and wherein the at least one cold plate includes an outer surface having a heat absorbing face.

15. The immersion cooling system as claimed in claim 14, wherein the at least one cold plate includes at least one fixing portion.

16. The immersion cooling system as claimed in claim 1, wherein the first port intercommunicates with a liquid outlet of a pump, and wherein the pump has a liquid inlet located in the circulating layer.

17. The immersion cooling system as claimed in claim 16, wherein the pump is located in the chamber.

18. The immersion cooling system as claimed in claim 1, wherein the circulating cooling module includes a check valve located between the heat absorbing section and the first port, and wherein the check valve includes an inlet intercommunicating with the first port.

19. The immersion cooling system as claimed in claim 1, wherein the circulating cooling module further includes a plurality of cooling fins coupled to an outer surface of the circulating pipeline, and wherein the plurality of cooling fins is located in the working layer.

20. The immersion cooling system as claimed in claim 1, further comprising an air layer formed by air in the chamber, wherein the circulating cooling module further includes a plurality of cooling fins coupled to an outer surface of the circulating pipeline, and wherein the plurality of cooling fins is located in the air layer.

21. The immersion cooling system as claimed in claim 1, wherein a color of the first working liquid is different from a color of the second working liquid.

22. The immersion cooling system as claimed in claim 21, wherein the color of the first working liquid and/or the color of the second working liquid is blended by fat-soluble dyeing agents.

23. The immersion cooling system as claimed in claim 1, further comprising at least one electronic device, wherein the at least one electronic device includes at least one heat source located in the working layer.

* * * * *